(12) United States Patent
Wu et al.

(10) Patent No.: US 12,034,360 B2
(45) Date of Patent: Jul. 9, 2024

(54) BRUSHLESS MOTOR WITH INTERNAL INTEGRATED HEAT DISSIPATION MODULE THEREOF

(71) Applicant: Nanchang Sanrui Intelligent Technology Co., Ltd., Nanchang (CN)

(72) Inventors: Qicai Wu, Nanchang (CN); Jichang Gan, Nanchang (CN); Min Wu, Nanchang (CN); Huaqiu Huang, Nanchang (CN)

( * ) Notice: Subject to any disclaimer, the term of this patent is extended or adjusted under 35 U.S.C. 154(b) by 251 days.

(21) Appl. No.: 17/747,975

(22) Filed: May 18, 2022

(65) Prior Publication Data

US 2023/0134108 A1    May 4, 2023

(30) Foreign Application Priority Data

Nov. 4, 2021   (CN) .......................... 202111297446.1

(51) Int. Cl.
*H02K 9/22* (2006.01)
*H02K 5/10* (2006.01)
*H02K 9/19* (2006.01)
*H05K 7/20* (2006.01)

(52) U.S. Cl.
CPC ................. *H02K 9/22* (2013.01); *H02K 5/10* (2013.01); *H02K 9/19* (2013.01); *H05K 7/20909* (2013.01); *H05K 7/20945* (2013.01)

(58) Field of Classification Search
CPC .. H02K 9/22; H02K 5/10; H02K 9/19; H02K 7/20909; H05K 7/20945
USPC .......................................................... 310/52
See application file for complete search history.

(56) References Cited

FOREIGN PATENT DOCUMENTS

CN           111864992      * 10/2020    ............... H02K 9/08

* cited by examiner

*Primary Examiner* — Terrance L Kenerly
(74) *Attorney, Agent, or Firm* — Sandy Lipkin

(57) ABSTRACT

A brushless motor with an internal integrated heat dissipation module thereof is provided. The brushless motor includes a stator including at least one recess to receive a corresponding heat dissipation module therein, and an outer rotor, the heat dissipation module sliding in the corresponding recess to contract to the bottom of the recess; an ejection element arranged in the recess for pushing the heat dissipation module outwards from the recess; two to four temperature sensors integrated in the heat dissipation module; the outer rotor including an annular pressing plate formed at a top thereof to bind and compress a wire harness at the end of a coil winding; an interior cavity inside the stator providing an annular baffle for dividing the cavity into inner and outer parts, and sealing the internal cavity, thereby air only flowing, through the external part near the outer side of the annular baffle.

6 Claims, 6 Drawing Sheets

BRUSHLESS MOTOR WITH INTERNAL INTEGRATED HEAT DISSIPATION MODULE THEREOF

BACKGROUND

1. Technical Field

The present disclosure generally relates to the field of motors, and especially relates to a brushless motor with an internal integrated heat dissipation module thereof.

2. Description of Related Art

A brushless motor with an outer rotor has advantages of large torque, a high speed, a low power consumption and low noise, which is usually used by an electric aircraft. Compared with an aircraft that is powered by a heat engine, the electric aircraft has advantages of low noise, being more concealed during military reconnaissance, a higher survival capability and a higher mission success rate. In this way, the electric aircraft can be used in various fields such as military reconnaissance, environmental monitoring, emergency rescue and disaster relief and other fields.

However, a conventional brushless motor with the outer rotor has the following problems:

Firstly, with the increasing of power density of the motor, heat dissipation is becoming more and more serious;

Secondly, for the brushless motor with the outer rotor, there has been a design of using fins for heat dissipation inside the motor, and the fins and a stator are integrated with each, other;

Thirdly, for the design that the fins and the stator are integrated with each other, an inner wall surface of an iron core coil, which is taken as an only heating source of the motor, is in contact with an outer ring wall surface of the stator. Due to process requirements of assembling the motor, a certain gap is formed between a diameter of the outer ring wall of the stator and a diameter of the inner ring wall of the iron core, so that a thermal resistance that the two walls contact with each other for transferring heat is directly increased by the gap, which seriously affects the heat transfer effect;

Fourthly, in order to fill the gap between the wall surface of the outer ring of the stator and the wall surface of the inner ring of the iron core, thermal conductive silicone grease with high thermal conductivity can be applied. However, after the outer ring of the stator and the inner ring of the iron core are processed, the diameter of the inner wall and the diameter of outer wall are fixed. If more silicone grease is needed to be applied, the gap should be larger; if the gap is small, the silicone grease that has been applied will be scraped off by the inner wall surface of the iron core when the silicone grease is installed into the iron core, which will affect the heat dissipation effect.

SUMMARY

The technical problems to be solved: in view of the shortcomings of the related art, the present disclosure provides a brushless motor with an internal integrated heat dissipation module thereof, to provide a recess that can ensure the heat dissipation module have a certain movable space, and prevent an iron core from scraping heat-conducting silicone grease that is formed on a surface of a cooling fin during installing the iron core; and to provide an annular baffle which can increase an air flow and a flow rate near the heat dissipation module and improve the heat dissipation capacity thereof.

The technical solution adopted for solving technical problems of the present disclosure is: a brushless motor with an internal integrated heat dissipation module thereof includes a stator and an outer rotor, the stator including at least one recess for receiving a corresponding heat dissipation module therein so that the heat dissipation module can slide in the recess to contract to the bottom of the recess; an arc-shaped curved surface of the heat dissipation module lower than an arc-shaped surface of an outer ring of the stator so that the arc-shaped curved surface of the heat dissipation module is misaligned with the arc-shaped surface of an outer ring of the stator; an ejection element arranged in the recess for pushing the heat dissipation module outwards from the recess;

Two to four temperature sensors integrated in the heat dissipation module and configured to measure an area temperature of the heat dissipation module;

An annular pressing plate mounted on the top of the outer rotor, and configured to bind and compress a wire harness at the end of a coil winding; and An annular baffle arranged in an interior cavity inside the stator and configured to divide the interior cavity into an inner cavity and an outer cavity for sealing the interior cavity, so that air only flows through the outer cavity that are close to the outer side of the annular baffle.

Wherein the ejection element includes a pressing bar and a plurality of wedge blocks arranged on the heat dissipation module, the stator including a plurality of vertical receiving holes, the recess including a plurality of locating holes engaged with the plurality of wedge blocks, and communicated with the plurality of vertical receiving holes, and wherein the plurality of wedge blocks is pushed outwards from the plurality of locating holes after the pressing bar is pressed down by the annular pressing plate.

Wherein the wedge block includes a first inclining surface formed on an end of the wedge block away from the heat dissipation module, and the pressing bar includes a second inclining surface engaged with the first inclining surface.

Wherein the pressing bar further includes a pair of receiving grooves, a first boss and a second boss respectively arranged in the receiving groove, and the second inclining surface arranged on lower ends of the first boss and the second boss.

Wherein a first bolt hole is arranged on the annular pressing plate, and the stator includes a second bolt hole corresponding to the first bolt hole, and the first bolt hole matched with the second bolt hole through bolts.

Wherein the heat dissipation module is an air-cooling fin or a liquid cooling head.

Wherein a cooling fan with an independent temperature control is integrated in a lower part of the stator, and an air outlet of the cooling fan facing upwardly to face a plurality of cavity runners of the heat dissipation module; the cooling fan configured to perform controllable speed regulation according to temperature data of the atmospheric and temperature data of a plurality of areas in the brushless motor, and when the temperature is higher than a preset value, the cooling fan automatically speeds up a speed to convey more air to the interior of the brushless motor, so as to assist heat dissipation of centrifugal fan blades at the top of the brushless motor.

The present disclosure provides the advantages as below.

Firstly, the brushless motor with the internal integrated heat dissipation module of the present disclosure provides the recess which can ensure the heat dissipation module have a certain movable space, and can prevent the iron core from scraping heat-conducting silicone grease that is formed on the arc-shaped curved surface of a cooling fin during installing the iron core.

Secondly, the ejector assembly of the present disclosure can be linked to compress all heat dissipation modules that have been distributed, so that the heat dissipation module can be compacted to the inner surface of the iron core with a sufficient compression force, which can greatly reduce contact thermal resistance of the brushless motor, to fully exert the effect of heat-conducting silicone grease.

Thirdly, the same stator of the present disclosure can be divided into two heat dissipation modules with an air cooling and liquid cooling, so that a production cost can be greatly reduced and the versatility of parts for main structures can be enhanced.

Fourthly, the ejection mechanism and the recess are provided to fix the heat dissipation module, so that the heat dissipation module can be upgraded.

Fifthly, the bottom temperature control cooling fan of the present disclosure can cooperate with the centrifugal fan at the top of the motor to enhance air cooling and heat dissipation, and in addition, the temperature control cooling fan can still work continuously to send airflow to accelerate cooling performance after the motor stops working.

Sixthly, the annular baffle is additionally arranged in the cavity inside the motor and used for increasing the air flow and the flow speed near the heat dissipation module to improve the heat dissipation capacity.

Seventhly, the annular pressing plate of the present disclosure binds and compresses the wire harness at the end of the coil winding, thereby avoiding using curing glue to fix the wire harness; at the same time, the lower surface of the annular pressing plate is in contact with the wire harness, when the motor works, the heat, generated by the wire harness can be transmitted to the annular pressing plate, while an upper surface of the annular pressing plate is close to the centrifugal fan at the top of the motor, and the annular pressing plate can be dissipated with the help of high-speed rotating airflow.

BRIEF DESCRIPTION OF THE DRAWINGS

The accompanying drawings, which are included to provide a further understanding of the present disclosure and are incorporated in and constitute a part of the specification, illustrate embodiment of the present disclosure and together with the description serve to explain the present disclosure which are not by way of the limitation of the present disclosure.

The element labels according to the exemplary embodiment of the present disclosure shown as below:

1 annular pressing plate, 2 outer rotor, 3 pressing bar, 4 receiving hole, 5 wedge block, 6 heat dissipation module, 7 locating hole, 8 recess, 9 second bolt hole, 10 first bolt hole, 11 first boss, 12 receiving groove, 13 second boss, 14 second inclining surface, 15 first inclining surface, 16 stator, 17 screwing hole, 18 through-hole, 19 annular baffle, 20 interior cavity.

DETAILED DESCRIPTION

Embodiment of the present disclosure will be described in detail with reference to the accompanying drawings and examples, so that how to implement the technical means for solving the technical problems to obtain the technical effects of the present disclosure can be fully understood and implemented.

In the description of the present disclosure, it needs to be explained that all the directional indicators (such as the terms: "center", "lateral", "longitudinal", "length", "width", "thickness", "upper", "lower", "front", "rear", "left", "right", "vertical", "horizontal", "top", "bottom", "inner", "outer", "clockwise" and "counterclockwise" etc.,), are shown in the specification of the present disclosure. The indicated orientation or position of the terms shown in the detailed description is based on the orientation or position shown in the figures of the accompanying drawings of the present disclosure, which is only to easily simplify the description of the present disclosure, but not indicated that the devices or elements of the present disclosure should have a particular orientation or should be designed and operated in a particular orientation. So the terms illustrated in the detail description are not by way of the limitation of the present disclosure.

Furthermore, in the description of the present disclosure, the terms such as "first" and "second" shown in the specification are only used to describe, but not indicated that the elements of the present disclosure is important, or represented the amount of the elements. That is, the features limited by the terms of "first" and "second" may explicitly or implicitly include one or more features. In the description of the present disclosure, "several/a plurality of" means two or more, unless otherwise specifically defined.

In the description of the present disclosure, except where specifically otherwise illustrated or limited, the terms "assemble" "connect" and "link" used herein should be understood in a broad sense. Such as, the meaning may be tight connection, removable connection, or integrated connection. The meaning may also be mechanical connection, electrical connection, direct connection or indirect connection through intermediaries, or internal connection within two elements. The meaning of the terms used herein may be understood by one of ordinary skill in the related art according to specific conditions of the present disclosure.

Figure 1:
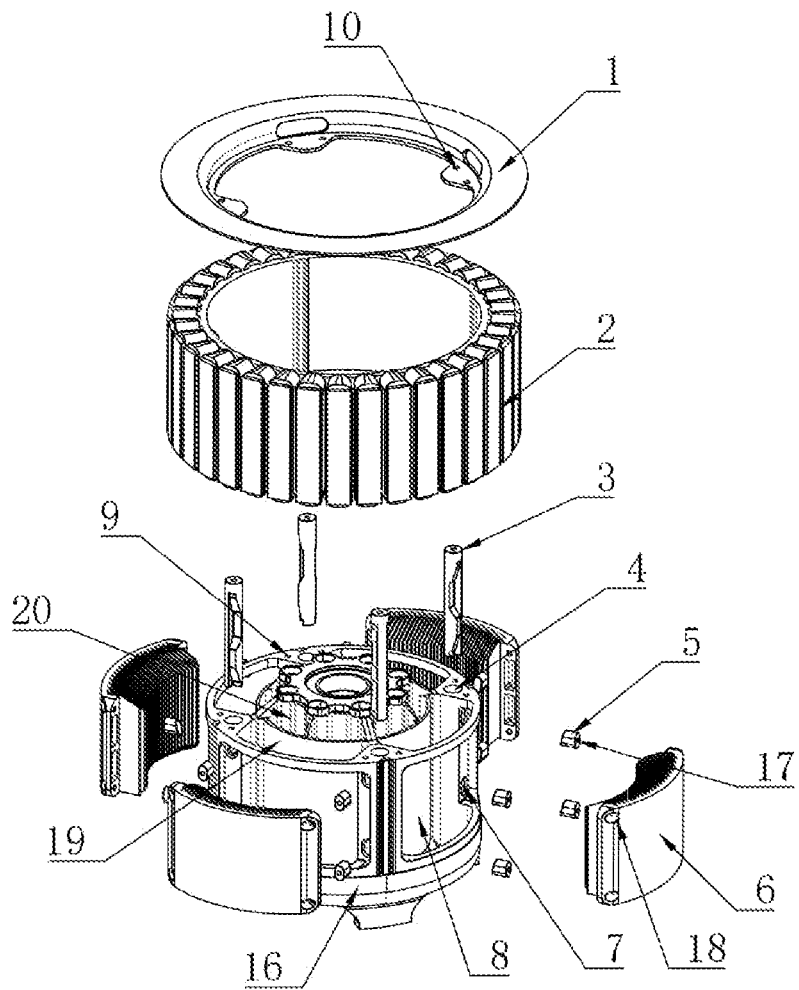
FIG. 1 is an exploded, schematic view of a brushless motor with an internal integrated heat dissipation module in accordance with an embodiment of the present disclosure.
Figure 2:
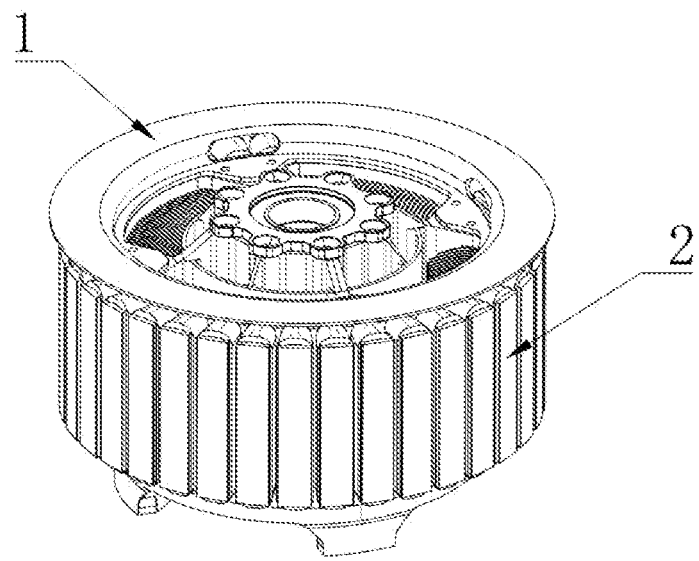
FIG. 2 is an overall schematic view of the brushless motor.
Figure 3:
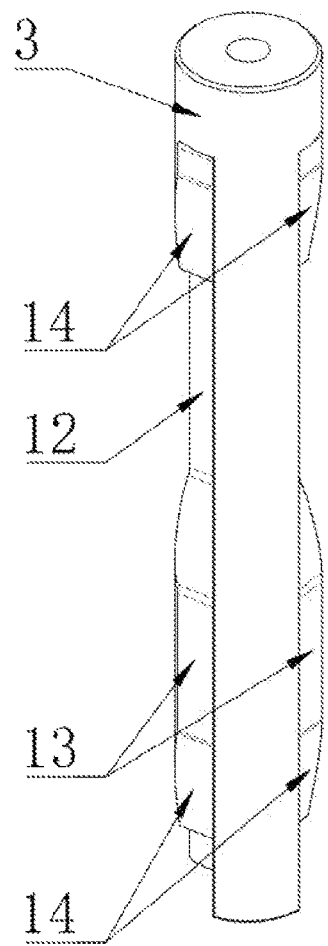
FIG. 3 is an enlarged, schematic view of a pressing bar of the brushless motor.
Figure 4:
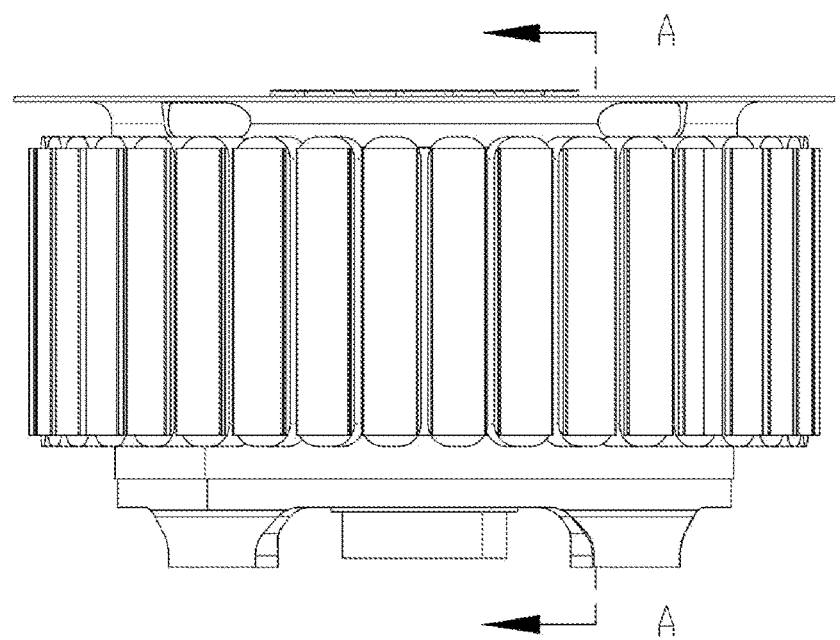
FIG. 4 is a front view of the brushless motor.
Figure 5:
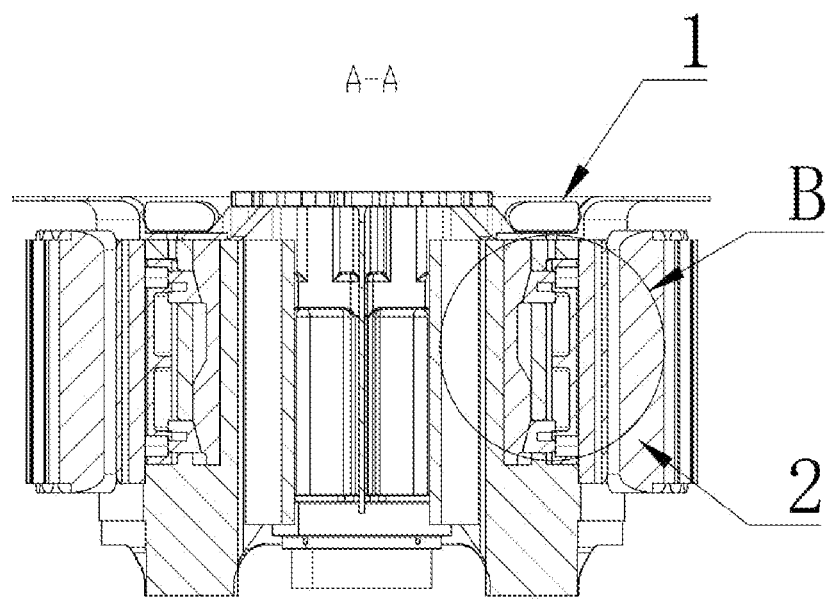
FIG. 5 is a cross-sectional view of the brushless motor of FIG. 4.
Figure 6:
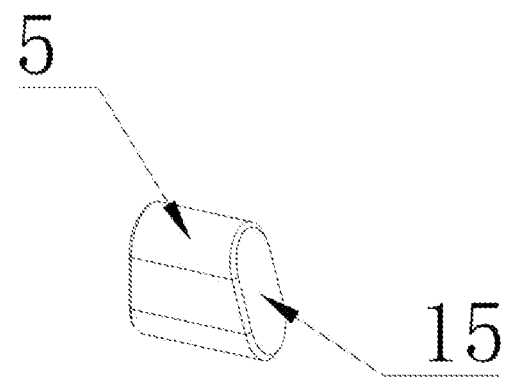
FIG. 6 is an enlarged, schematic view of a wedge block of the brushless motor.
Figure 7:
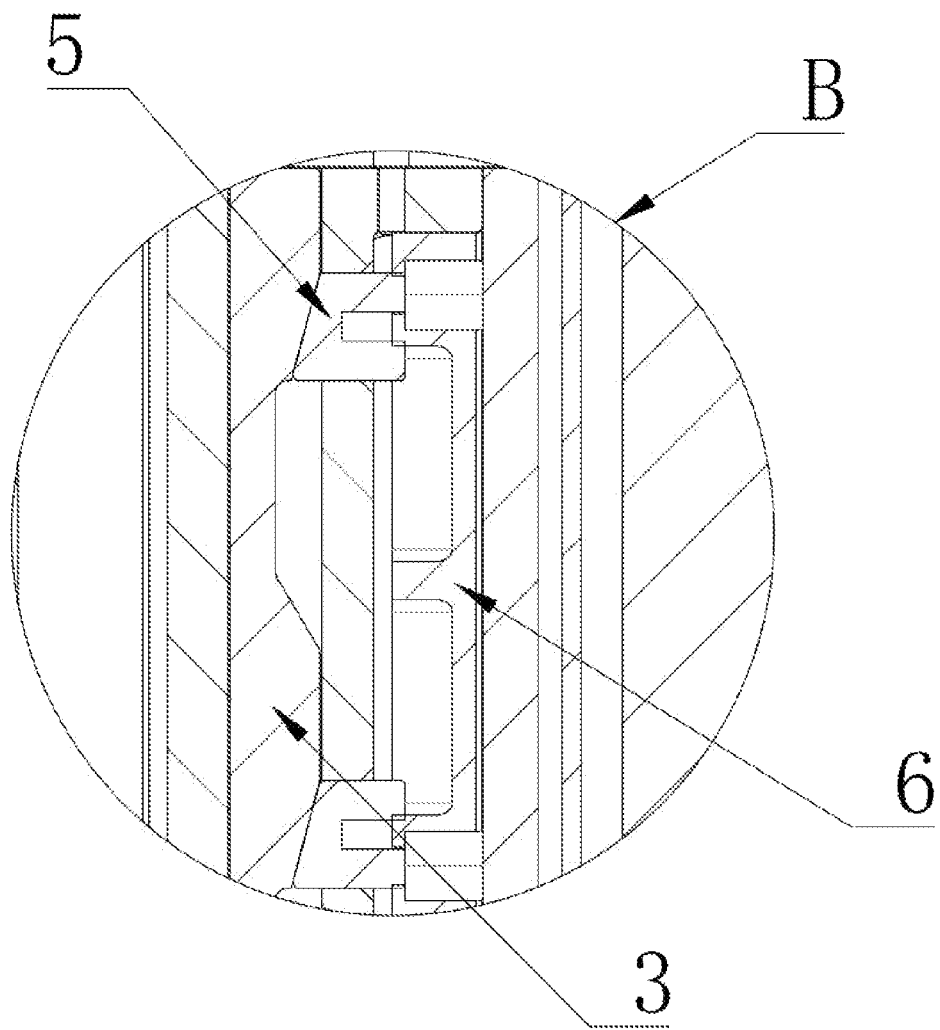
FIG. 7 is an enlarged, schematic view of part B of FIG. 5.
Figure 8:
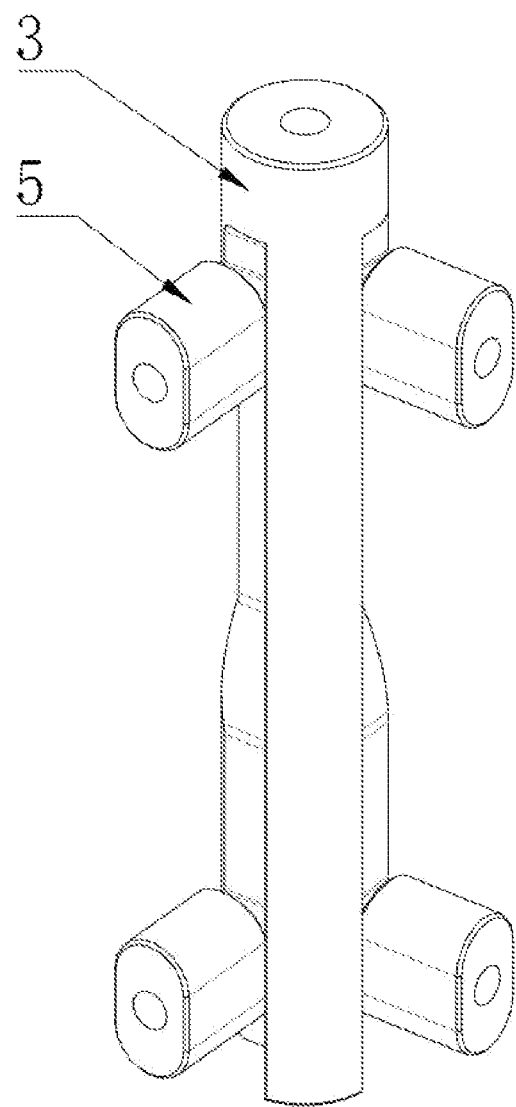
FIG. 8 is an assembly schematic view of the pressing bar and the wedge block of the brushless motor.
Figure 9:
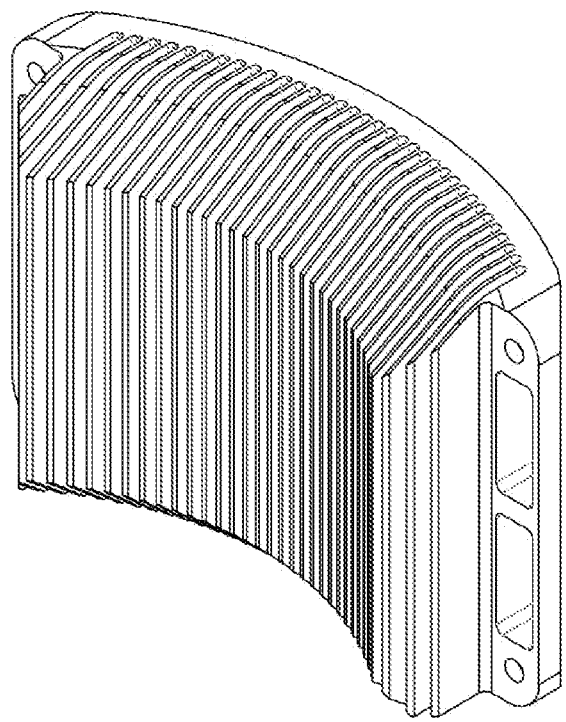
FIG. 9 is a schematic view of an air-cooling fin of the brushless motor.
Figure 10:
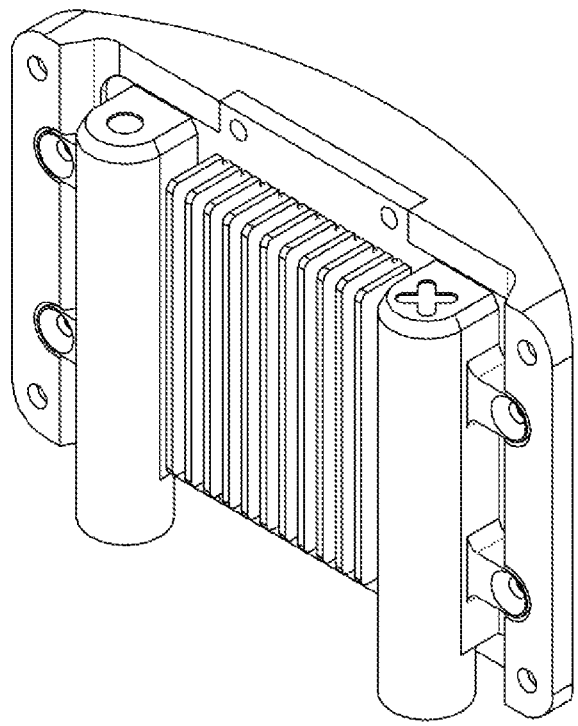
FIG. 10 is a schematic view of a liquid cooling head of the brushless motor.

Referring to FIGS. 1-10, a brushless motor with an internal integrated heat dissipation module according to an embodiment of the present disclosure includes: a stator 16 and an outer rotor 2, the stator 16 includes at least one recess 8 for receiving a corresponding heat dissipation module 6 therein so that the heat dissipation module 6 can slide in the recess 8 to contract to the bottom of the recess 8; an arc-shaped curved surface of the heat dissipation module 6 is lower than an arc-shaped surface of an outer ring of the stator 16 so that the arc-shaped curved surface of the heat dissipation module 6 is misaligned with the arc-shaped surface of an outer ring of the stator 16; and an ejection element is arranged in the recess 8 for pushing the heat dissipation module 6 outwards from the recess 8;

two to four temperature sensors are integrated in, the heat dissipation module 6 and configured to measure an area temperature of the heat dissipation module 6;

an annular pressing plate 1 is mounted on the top of the outer rotor 2, and configured to bind and compress a wire harness at the end of a coil winding; and an annular baffle 19 is arranged in an interior cavity 20 inside the stator 16 and configured to divide the cavity into an inner cavity and an outer cavity for sealing the interior cavity 20, so that air only flows through the outer cavity that are close to the outer side of the annular baffle 19.

Under a high-speed operation of the centrifugal fan that has been integrated into the motor, air will be sucked from the interior cavity 20. Before the annular baffle 19 is not arranged, high-speed airflow will be in an area near the inner side of the interior cavity 20, while split type cooling fins cannot be fully distributed in the whole area of the interior cavity 20, so that the airflow speed flowing through the cooling fins is very low. A cavity area near the outer side of the annular baffle 19 is a main placement area of the cooling fins, the annular baffle 19 is added to reduce a sectional area of each cavity airflow flowing through a channel, and the airflow speed of the airflow flowing through the cooling fins can increase the heat conduction efficiency of air and the cooling tins after the annular baffle 19 is arranged.

More specifically, two to four temperature sensors are integrated into each heat dissipation module to measure the temperature of each heat dissipation module. In this way, through a plurality of temperatures, it can comprehensively determine whether the installation of each heat dissipation module is properly compressed and whether thermal conductive silicone grease on a corresponding heat-conducting contact surface is correctly applied and filled. The heating elements of the motor, that is, an iron core and a coil winding provide with temperature sensors at a plurality of positions according to circumferential distribution, a plurality of sensors are also arranged near the bearing of the rotating shaft of the motor, and the temperature sensors are also integrated on the outside of the motor. In this way, the working state of the motor can be comprehensively determined through the temperature data at different positions of the motor and the atmospheric temperature data.

In the embodiment of the present disclosure, the ejection element includes a pressing bar 3 and a plurality of wedge blocks 5 arranged on the heat dissipation module 6 the stator 16 including a plurality of vertical receiving holes 4, the recess 8 including a plurality of locating holes 7 engaged with the plurality of wedge blocks 5, and communicated with the plurality of vertical receiving holes 4. The plurality of wedge blocks 5 is pushed outwards from the plurality of locating holes 7 after the pressing bar 3 is pressed down by the annular pressing plate 1.

In the embodiment of the present disclosure, the wedge block 5 includes a first inclining surface 15 formed on an end of the wedge block 5 away from the heat dissipation module 6, and the pressing bar 3 includes a second inclining surface 14 engaged with the first inclining surface 15.

In the embodiment of the present disclosure, the pressing bar 3 further includes a pair of receiving grooves 12, a first boss 11 and a second boss 13 respectively arranged in the receiving groove 12, and the second inclining surface 14 arranged on lower ends of the first boss 11 and the second boss 13.

In the embodiment of the present disclosure, a first bolt hole 10 is arranged on the annular pressing plate 1, and the stator 16 includes a second bolt hole 9 corresponding to the first bolt hole 10, the first bolt hole 10 matched with the second bolt hole 9 through bolts.

Furthermore, four through-holes 18 are formed in four corners of the heat dissipation module 6 correspondingly, screwing holes 17 are formed in the wedge block 5, screws in clearance fit with the through-holes 18, and the screws penetrate through the through-holes 18 to connect with the screwing holes 17. The screw and the through-hole 18 are in clearance fit, so that the wedge block 5 can be inclined within a certain range, and conveniently placed into the locating hole 7.

In the embodiment of the present disclosure, the heat dissipation module 6 is an air-cooling fin or a liquid cooling head. The heat dissipation module 6 with the air-cooling fin version relies on external airflow flowing through fins for heat exchange, allowing air to take away the heat. The heat dissipation module 6 with the liquid cooling version takes heat out of the motor from the interior of the motor to a cold bar that is arranged outside a propeller wake flow or a machine body through liquid that is in the liquid cooling circulation flow channel, and heat is taken away through heat exchange between the high-speed wake flow of the propeller or high-speed airflow outside the machine body and the cold bar.

In the embodiment of the present disclosure, a cooling fan with an independent temperature control is integrated in a lower part of the stator 16, and an air outlet of the cooling fan faces upwards to face a plurality of cavity flow channels of the heat dissipation g module 6. The cooling fan carries out controllable speed regulation according to the temperature data of the atmospheric and the temperature data of a plurality of areas in the motor, and when the temperature is higher than a preset value, the cooling fan automatically accelerates the rotating speed to convey more air to the interior of the motor, so as to assist the heat dissipation of blades in the centrifugal fan at the top of the motor. The inside of the motor still has a higher residual temperature after the motor stops working, the centrifugal fan at the top of the motor will no longer work because the motor stops working, but the cooling fan can continue to supply air until the temperature inside the motor decreases to be within an acceptable range, and therefore the time that the inside of the motor is at a high temperature can be shortened.

In addition, an alternative scheme is that the cooling fan with the independent temperature control is changed into an axial fan blade that is fixed with the main shaft of the motor, which synchronously rotates with the main shaft of the motor, so that the space of the fan can be reduced, and the temperature control part can also be simplified.

The iron core of the outer rotor and the stator of the present disclosure are fixed in the circumferential direction by four (or multiple, as long as the number is the same as that of the heat dissipation module) keys and keyways, so as to prevent the iron core from rotating due to its own electromagnetic force when the iron core works. The iron core is convenient to disassemble and assemble by using the keys and the keyways, so that the iron core can be repeatedly disassembled and assembled.

Before the iron core is not installed, each heat dissipation module can slide and contract to the bottom of the recess after being installed in the corresponding recess, so that the arc surface of the heat dissipation module is misaligned with the arc surface of the outer ring of the stator, such dislocation gap is enough apply thermal conductive silicone grease with a certain, thickness, and the coated silicone grease is prevented from being scraped by the inner wall surface of the iron core in the process of installing the iron core.

Specifically, the pressing bar 1 is directly arranged between every two recesses on the stator 16, and is matched with the wedge block 5 of two adjacent heat dissipation modules 6, the pressing bar 3 can move up and down in the receiving hole 4, an integral annular cover plate is arranged on the top of the stator 16 to press on four pressing bars 3. When the four pressing bars 3 are pressed into a specific size, the second inclining surface 14 on the first boss 11 and the second boss 12 cooperate with the first inclining surface 15 on the wedge block 5 to compress the wedge block 5 on the heat dissipation module 6, so that the four heat dissipation modules 6 are pushed radially from inside to outside, and finally the arc surface of the heat dissipation module 6 is compressed with the inner wall surface of the iron core, which can ensure that there is enough positive pressures to make the four heat dissipation modules 6 bear against the inner wall of the iron core in their respective directions, which greatly reduces the contact thermal resistance, so as to improve the thermal conductivity between the contact surfaces.

The specific embodiment of the present disclosure are described in detail above in combination with the accompanying drawings, but not limited to the above embodiment. Various changes can also be made within the knowledge of an, ordinary skilled person in the art without departing from the purpose of the present disclosure, each feature or element can be used alone or in other various combinations within the principles of the present disclosure to the full extent indicated by the broad general meaning of the terms in which the appended claims are expressed.

What is claimed is:

1. A brushless motor with an internal integrated heat dissipation module thereof comprising a stator and an outer rotor, the stator comprising at least one recess for receiving a corresponding heat dissipation module therein so that the heat dissipation module can slide in the recess to contract to the bottom of the recess; an arc-shaped curved surface of the heat dissipation module lower than an arc-shaped surface of an outer ring of the stator so that the arc-shaped curved surface of the heat dissipation module is misaligned with the arc-shaped surface of an outer ring of the stator; an ejection element arranged in the recess for pushing the heat dissipation module outwards from the recess;

the ejection element comprising a pressing bar and a plurality of wedge blocks arranged on the heat dissipation module, the stator comprising a plurality of vertical receiving holes, the recess comprising a plurality of locating holes engaged with the plurality of wedge blocks, and communicated with the plurality of vertical receiving holes, and wherein the plurality of wedge blocks is pushed outwards from the plurality of locating holes after the pressing bar is pressed down by an annular pressing plate;

two to four temperature sensors integrated in the heat dissipation module and configured to measure an area temperature of the heat dissipation module;

the annular pressing plate mounted on the top of the outer rotor, and configured to bind and compress a wire harness at the end of a coil winding; and an annular baffle arranged in an interior cavity inside the stator and configured to divide the interior cavity into an inner cavity and an outer cavity for sealing the interior cavity, so that air only flows through the outer cavity that are is close to the outer side of the annular baffle.

2. The brushless motor as claimed in claim 1, wherein the wedge block comprises a first inclining surface formed on an end of the wedge block away from the heat dissipation module, and the pressing bar comprises a second inclining surface engaged with the first inclining surface.

3. The brushless motor as claimed in claim 2, wherein the pressing bar further comprises a pair of receiving grooves, a first boss and a second boss respectively arranged in the receiving groove, and the second inclining surface arranged on lower ends of the first boss and the second boss.

4. The brushless motor as claimed in claim 1, wherein a first bolt hole is arranged on the annular pressing plate, and the stator comprises a second bolt hole corresponding to the first bolt hole, and the first bolt hole matched with the second bolt hole through bolts.

5. The brushless motor as claimed in claim 1, wherein the heat dissipation module is an air-cooling fin or a liquid cooling head.

6. The brushless motor as claimed in claim 1, wherein a cooling fan with an independent temperature control is integrated in a lower part of the stator, and an air outlet of the cooling fan facing upwardly to face a plurality of cavity runners of the heat dissipation module; the cooling fan configured to perform controllable speed regulation according to temperature data of the atmospheric and temperature data of a plurality of areas in the brushless motor, and when the temperature is higher than a preset value, the cooling fan automatically speeds up the cooling fan speed to convey more air volume to the interior of the brushless motor, so as to assist heat dissipation of centrifugal fan blades at the top of the brushless motor.

* * * * *